US010261424B2

(12) United States Patent
Dinger et al.

(10) Patent No.: US 10,261,424 B2
(45) Date of Patent: Apr. 16, 2019

(54) LITHOGRAPHY APPARATUS AND METHOD FOR OPERATING A LITHOGRAPHY APPARATUS

(71) Applicant: Carl Zeiss SMT GmbH, Oberkochen (DE)

(72) Inventors: Udo Dinger, Oberkochen (DE); Markus Holz, Aalen (DE); Ulrich Bihr, Kirchheim/Dirgenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/845,590

(22) Filed: Dec. 18, 2017

(65) Prior Publication Data

US 2018/0107122 A1 Apr. 19, 2018

Related U.S. Application Data

(63) Continuation of application No. PCT/EP2016/066105, filed on Jul. 7, 2016.

(30) Foreign Application Priority Data

Jul. 7, 2015 (DE) .................. 10 2015 212 658

(51) Int. Cl.
*G03F 7/20* (2006.01)
*G02B 26/08* (2006.01)

(52) U.S. Cl.
CPC ..... *G03F 7/70575* (2013.01); *G02B 26/0833* (2013.01); *G03F 7/70033* (2013.01);
(Continued)

(58) Field of Classification Search
CPC ............ G02B 26/0833; G03F 7/70033; G03F 7/70116; G03F 7/70258; G03F 7/70575; G03F 7/7085
See application file for complete search history.

(56) References Cited

U.S. PATENT DOCUMENTS

2008/0079930 A1 8/2008 Klarenbeek
2009/0117494 A1 5/2009 Owa
(Continued)

FOREIGN PATENT DOCUMENTS

DE 10 2012 218 219 A1 4/2014
DE 10 2013 209 442 A1 11/2014
(Continued)

OTHER PUBLICATIONS

International Search Report for corresponding PCT Appl No. PCT/EP2016/066105, dated Oct. 28, 2016.

*Primary Examiner* — Steven Whitesell Gordon
(74) *Attorney, Agent, or Firm* — Fish & Richardson P.C.

(57) ABSTRACT

A lithography apparatus includes a radiation source configured to produce radiation having a repetition frequency. The lithography apparatus also includes an optical component configured to guide the radiation within the lithography apparatus. The lithography apparatus further includes an actuator device configured to displace the optical component. In addition, the lithography apparatus includes a measurement device configured to determine a position of the optical component via a measurement signal having a measurement signal frequency. The measurement signal frequency is unequal to the repetition frequency, and the measurement signal frequency is unequal to integer multiples of the repetition frequency.

29 Claims, 15 Drawing Sheets

(52) U.S. Cl.
CPC ........ *G03F 7/7085* (2013.01); *G03F 7/70116* (2013.01); *G03F 7/70258* (2013.01)

(56) References Cited

U.S. PATENT DOCUMENTS

| | | |
|---|---|---|
| 2009/0262324 A1 | 10/2009 | Patra et al. |
| 2012/0044474 A1 | 2/2012 | Hauf et al. |
| 2014/0226141 A1 | 8/2014 | Xalter et al. |
| 2015/0185469 A1* | 7/2015 | Horn .................. G02B 26/0841 355/67 |
| 2017/0363965 A1* | 12/2017 | Butler .................. G03F 7/70258 |

FOREIGN PATENT DOCUMENTS

| | | |
|---|---|---|
| WO | WO 2009/100856 A1 | 8/2009 |
| WO | WO 2010/049076 A1 | 5/2010 |

* cited by examiner ically displaceable individual mirrors. To ensure the optical quality of a projection exposure apparatus, very precise positioning of the displaceable individual mirrors is desired.

Furthermore, document DE 10 2013 209 442 A1 describes that the field facet mirror can be in the form of a microelectromechanical system (MEMS). However, pulsed plasma can be produced in the residual gas in the illumination system due to the photons of the EUV radiation source of the lithography apparatus, and electrons can be liberated from the mirror surfaces of the MEMS mirrors due to the photoelectric effect. This can bring about temporally and spatially varying current flows over the MEMS mirrors of the field facet mirror. These temporally and spatially varying current flows over the MEMS mirrors can significantly disturb the evaluation electronics of the apparatus for monitoring the tilt angle of the respective mirror.

SUMMARY

The present disclosure seeks to provide an improved lithography apparatus.

Accordingly proposed is a lithography apparatus which includes a radiation source for producing radiation having a specific repetition frequency, an optical component for guiding the radiation within the lithography apparatus, an actuator device for displacing the optical component, and a measurement device for determining a position of the optical component using a measurement signal having a specific measurement signal frequency, wherein the measurement signal frequency is unequal to the repetition frequency and unequal to integer multiples of the repetition frequency.

The radiation produced by the radiation source with its high-energy photons can result in a charge transfer to the optical component or away from the optical component. In particular in the case of an optical component which is displaceable by way of electromechanical actuation, the charge transfer can result in a mechanical excitation of the optical component. In other words, the optical component can be mechanically excited and/or disturbed by way of being subjected to radiation. In particular, high-energy photons from the radiation source, in particular EUV photons, can result in production of a plasma, in particular a hydrogen plasma. Alternatively, argon (Ar) or helium (He) can be used as purge gas. Here, for example oxygen (O) and nitrogen (N) can then be mixed in.

Due to the fact that the measurement signal frequency of the measurement device is unequal to the repetition frequency of the radiation source and unequal to the integer multiples of the repetition frequency, the measurement device is advantageously desensitized. The measurement device is in particular desensitised with respect to current pulses which are produced owing to the wavelengths used, for example 0.1 nm to 30 nm, of the radiation source by way of charge carriers that are ejected from the surface of the optical component or the plasma.

The displaceable optical component can be in particular a mirror, in particular a micromirror, i.e. a mirror having a side length of less than 1 mm. The mirror or micromirror can in particular be part of a multi-mirror array (MMA). The MMA can include more than 1000, in particular more than 10,000, in particular preferably more than 100,000 such mirrors. In particular, these can be mirrors for reflecting EUV radiation.

The optical component can in particular be part of a facet mirror, in particular a field facet mirror, of a beam-shaping and illumination system of the lithography apparatus. Here, the optical component is arranged in particular in an evacuable chamber. During operation of the lithography appara-

LITHOGRAPHY APPARATUS AND METHOD FOR OPERATING A LITHOGRAPHY APPARATUS

CROSS-REFERENCE TO RELATED APPLICATIONS

The present application is a continuation of, and claims benefit under 35 USC 120 to, international application PCT/EP2016/066105, filed Jul. 7, 2016, which claims benefit under 35 USC 119 of German Application No. 10 2015 212 658.7, filed Jul. 7, 2015. The entire disclosure of these applications are incorporated by reference herein.

FIELD

The present disclosure relates to a lithography apparatus and to a method for operating a lithography apparatus. The lithography apparatus includes a radiation source for producing radiation having a specific repetition frequency, an optical component, for example a mirror, for guiding the radiation within the lithography apparatus, an actuator device for displacing the optical component, and a measurement device for determining a position of the optical component.

BACKGROUND

Microlithography is used for producing microstructured components, for example integrated circuits. The microlithographic process is carried out with a lithography apparatus, which has an illumination system and a projection system. The image of a mask (reticle) illuminated via the illumination system is in this case projected via the projection system onto a substrate (for example a silicon wafer) coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light with a wavelength in the range of 0.1 nm to 30 nm, in particular 4 nm to 6 nm, are currently under development. In the case of such EUV lithography apparatuses, because of the high absorption of light of this wavelength by most materials, reflective optical units, that is to say mirrors, have to be used instead of—as previously—refractive optical units, that is to say lens elements. For the same reason, beam shaping and beam projection should be carried out in a vacuum.

The mirrors may for example be fastened to a supporting frame (force frame) and be configured to be at least partially manipulable or tiltable in order to allow a movement of a respective mirror in up to six degrees of freedom, and consequently a highly accurate positioning of the mirrors in relation to one another, in particular in the pm range. This allows changes in the optical properties that occur for instance during the operation of the lithography apparatus, for example as a result of thermal influences, to be corrected.

For the purposes of displacing the mirrors, in particular in the six degrees of freedom, actuators which are actuated by way of a control loop are assigned to the former. An apparatus for monitoring the tilt angle of a respective mirror is provided as part of the control loop.

For example, WO 2009/100856 A1 discloses a facet mirror for a projection exposure apparatus of a lithography apparatus, which has a multiplicity of individually displacetus, the evacuable chamber can be evacuated in particular to a pressure of less than 50 Pa, in particular less than 20 Pa, in particular less than 10 Pa, in particular less than 5 Pa. This pressure gives in particular the partial pressure of hydrogen in the evacuable chamber.

The radiation source is in particular an EUV radiation source having emitted used radiation in the region between 0.1 nm and 30 nm, preferably between 4 and 6 nm. This can be a plasma source, for example a GDPP (Gas Discharge Produced Plasma) source or an LPP (Laser Produced Plasma) source. Other EUV radiation sources, for example based on a synchrotron or on a free electron laser (FEL) are possible.

According to one embodiment, $|f2-n\cdot f1|>B$. In this case, f1 designates the repetition frequency, f2 designates the measurement signal frequency, n designates integer multiples of the repetition frequency f1, and B designates the measurement bandwidth or bandwidth. The condition $|f2-n\cdot f1|>B$ is a suitable safety limit to ensure that the measurement device is desensitized with respect to EUV-induced current pulses. The measurement bandwidth B is, for example, f1/100.

According to another embodiment, the measurement signal frequency f2 is unequal to the repetition frequency f1, unequal to the integer multiples of the repetition frequency f1, and less than a maximum cut-off frequency for the measurement signal frequency f2.

The maximum cut-off frequency for the measurement signal frequency depends in particular on the application and can be derived from the sampling frequency with which the optical component and the actuator and/or sensor device, which is coupled to the optical component, are sampled. By way of example, the maximum cut-off frequency is 10 MHz.

In accordance with a further embodiment, at least one predetermined bandwidth B is provided between the measurement signal frequency f2 and the repetition frequency f1. Furthermore, in each case at least one predetermined bandwidth B is provided between the measurement signal frequency f2 and the respective integer multiple of the repetition frequency f1.

By using the predetermined band width B between the measurement signal frequency f1 and the repetition frequency or the integer multiple thereof, a certain signal-to-noise ratio can be ensured. This in turn ensures precise measurement of the displacement or the position of the optical component. The predetermined bandwidth B also ensures that the position or displacement of the optical component can be dynamically measured. It is therefore also possible to correct the position of the optical component.

In accordance with a further embodiment, the predetermined bandwidth is at least 1 kHz, preferably at least 10 kHz, with particular preference at least 20 kHz.

In accordance with a further embodiment, the lithography apparatus includes a setting device for setting the measurement signal frequency f2 in dependence on the repetition frequency f1.

The setting device is thus configured to adjust the measurement signal frequency f2 in accordance with the repetition frequency f1 of the radiation source. The fact that the repetition frequency f1 is variable in particular involves an active change of the repetition frequency, for example by way of a control device, but also a passive change of the repetition frequency, for example caused by ageing or thermal effects.

In accordance with a further embodiment, the measurement signal frequency f2 is a sampling frequency, wherein the measurement device is configured to sample the optical component and the actuator and/or sensor device, which is connected to the optical component, with the sampling frequency. The actuator and/or sensor device can include in particular electrodes or sensor electrodes.

In accordance with a further embodiment, the measurement device is configured to excite the optical component and the actuator and/or sensor device, which is connected to the optical component, with an excitation signal having a predetermined excitation frequency f3 and to subsequently sample them with the sampling frequency f2, with the excitation frequency f3 being equal to the sampling frequency f2 (f3=f2).

In accordance with a further embodiment, the lithography apparatus includes a control device for targeted application of an electrical bias potential to the optical component.

By applying electrical bias potential to the optical component, the interaction between the optical component and the assigned actuator and/or sensor device and the surrounding area thereof, in particular a plasma that has been produced, can be reduced, in particular minimized, and preferably eliminated.

In other words, the electrical bias potential is applied to the optical component with the result that the entire optical component, preferably the optically active surface thereof, is at the potential. It is thus possible to reduce, in particular minimize, preferably eliminate, the radiation-induced, in particular the plasma-induced charge transport to the optical component. The bias potential is preferably chosen such that the current that flows out via the optical component is reduced, in particular minimized, in particular eliminated.

The bias potential can be fixedly specified. Alternatively, it can be controllable, preferably by closed-loop control.

In accordance with a further embodiment, the control device has a look-up table to determine the bias potential that is to be applied to the optical component.

By using the look-up table (LUT), the complexity of the control device is simplified. Determination of the bias potential using the look-up table in particular makes simple and cost-effective control possible. It is also possible to equip the control device with several look-up tables for different operating modes of the lithography apparatus. For example, a separate look-up table can be provided in each case for different radiation sources. The look-up tables can each have different values for the bias potential to be applied for different operating modes of the radiation source. Provided here can be in particular different pulse frequencies, pulse durations and intensities of the radiation source and also different states of the evacuable chamber, in particular the pressure thereof, in particular the partial pressures for different gases, and also the gas composition in the chamber.

The look-up table or look-up tables can be determined off-line. They can in particular also be determined experimentally.

In accordance with a further embodiment, the control device is configured in the form of a closed-loop control device having at least one sensor.

For example, an electric current flowing out via the optical component can be captured using the sensor. The sensor can be used in particular to render the determination of the bias potential dynamically controllable by way of closed-loop control. As a result, the stability of the optical component is further improved. In particular it is possible to monitor the effect of the bias potential using the sensor and to calibrate the exact value of the bias potential to be applied during the operation of the lithography apparatus. In addition, the sensor is preferably configured to determine the repetition frequency and the temporality thereof.

In accordance with a further embodiment, the lithography apparatus is an EUV lithography apparatus.

In accordance with a further embodiment, the radiation source is an EUV radiation source, which is configured for producing EUV radiation having the predetermined repetition frequency f1.

In accordance with a further embodiment, the measurement device includes a capacitive sensor for measuring the position of a tilt angle of the optical component.

In accordance with a further embodiment, the electrodes of the capacitive sensor are in the shape of a comb and are arranged in intermeshed fashion.

According to a further embodiment, the optical component is a mirror.

In accordance with a further embodiment, the optical component is an individual mirror of a field facet mirror of a beam-shaping and illumination system of the lithography apparatus.

In accordance with a further embodiment, the optical component is an individual mirror of a pupil facet mirror of a beam-shaping and illumination system of the lithography apparatus.

The individual mirrors are displaceable, in particular positionable, in each case via an actuator device with a number of electromagnetically, in particular electrostatically, operating actuators. The actuators can be produced in a batch process as a microelectromechanical system (MEMS). For details, reference is made to document WO 2010/049 076 A1, the content of which is incorporated herein. To form the field facet mirror and to form the pupil facet mirror, reference is made to DE 10 2013 209 442 A1, the content of which is incorporated herein.

Additionally proposed is a method for operating a lithography apparatus. The lithography apparatus includes a radiation source for producing radiation having a specific repetition frequency f1, an optical component for guiding the radiation within the lithography apparatus, an actuator device for displacing the optical component, and a measurement device for determining a position of the optical component. Here, the position of the optical component is determined by the measurement device using a measurement signal having a specific measurement signal frequency f2, wherein the measurement signal frequency f2 is unequal to the repetition frequency f1 and unequal to integer multiples of the repetition frequency f1.

In particular, the measurement signal frequency f2 is set, in particular controlled by openloop or closed-loop-control, such that it is unequal to the repetition frequency f1 and unequal to the integer multiples of the repetition frequency f1.

The embodiments and features described for the proposed apparatus are correspondingly applicable to the proposed method.

Furthermore proposed is a computer program product which initiates the operation of a lithography apparatus of the method as explained above on a program-controlled device in a manner such that the measurement signal frequency f2 is unequal to the repetition frequency f1 and unequal to integer multiples of the repetition frequency f1.

A computer program product, such as e.g. a computer program, can be provided or supplied, for example, as a storage medium, such as e.g. a memory card, a USB stick, a CD-ROM, a DVD, or else in the form of a downloadable file from a server in a network. By way of example, in the case of a wireless communications network, this can be effectuated by transferring an appropriate file with the computer program product or the computer program.

Proposed in accordance with a further aspect is a lithography apparatus which includes a radiation source for producing radiation having a specific repetition frequency, an optical component for guiding the radiation within the lithography apparatus, an actuator device for displacing the optical component, a measurement device for determining a position of the optical component using a measurement signal, and a synchronization device. The synchronization device is configured to temporally synchronize the measurement signal and the radiation produced by the radiation source.

Synchronization of measurement signal and radiation here means in particular that the synchronization device has instantaneous information relating to how instantaneous the status of the radiation source is, that is to say in particular whether the radiation source is currently emitting the radiation or not and/or what the position of the radiation is. In dependence on this information, the synchronization device can derive and perform at least one action. Such an action can include adapting the measurement signal frequency of the measurement signal, adapting the phase of the measurement signal, and/or adapting an amplitude of the measurement signal.

In accordance with a development, the synchronization device is configured to receive instantaneous information relating to the radiation produced by the radiation source and to adapt the measurement signal in dependence on the received instantaneous information.

In accordance with a further development, the synchronization device is configured to adapt an amplitude of the measurement signal in dependence on the received instantaneous information.

In accordance with a further development, the synchronization device is configured to adapt a phase of the measurement signal in dependence on the received instantaneous information.

In accordance with a further development, the synchronization device is configured to adapt a measurement signal frequency of the measurement signal in dependence on the received instantaneous information.

In accordance with a further development, the synchronization device is configured to set the measurement signal frequency such that it is unequal to the repetition frequency and unequal to integer multiples of the repetition frequency.

In accordance with a further development, the synchronization device is configured to change the measurement signal using manipulation of the amplitude, the frequency or the phase of the excitation signal.

In accordance with a further development, the synchronization device is configured to manipulate the measurement signal by way of superposition of the excitation signal with at least one further signal.

In accordance with a further development, the synchronization device is configured to receive instantaneous information relating to the radiation produced by the radiation source and to adapt an evaluation of the measurement signal in dependence on the received instantaneous information.

In accordance with a further development, the synchronization device is configured to mask specific regions of the measurement signal during evaluation of the measurement signal in dependence on the received instantaneous information.

In accordance with a further development, the lithography apparatus includes a transmission device, which is configured to transmit the instantaneous information relating to the radiation produced by the radiation source, in particular a frequency, a phase and/or an amplitude of the radiation, from the radiation source to the synchronization device.

In accordance with a further development, the lithography apparatus includes an extraction unit, which is configured to extract the information relating to the radiation produced by the radiation source from a disturbance signal component of the measurement signal.

In accordance with a further development, the actuator device includes a suspension for mounting the optical component above a base plate, wherein the suspension is configured such that the electrical resistance of a path between the electrode, which is connected to the optical component, of the capacitive sensor, the optical component, the suspension and the electrical coupling to the measurement device is less than 1 kΩ, preferably less than 100Ω, particularly preferably less than 10Ω.

Due to the low electrical resistance of this path, the current-to-voltage conversion on the optical component is reduced. As a result, disturbances, caused by the photons of the EUV radiation source, in all frequency ranges are minimized.

In accordance with a further development, the suspension is produced from a doped semiconductor material, for example from a doped polysilicon.

The polysilicon of the suspension is doped in particular such that the electrical resistance of the path described in further detail above is minimized.

In accordance with a further development, the suspension is doped such that the electrical resistance of the path between the electrode, which is connected to the optical component, of the capacitive sensor, the optical component, the suspension and the electrical coupling to the measurement device is less than 1 kΩ, preferably less than 100Ω, particularly preferably less than 10Ω.

In accordance with a further development, the suspension is configured in terms of its geometry such that the electrical resistance of the path between the electrode, which is connected to the optical component, of the capacitive sensor, the optical component, the suspension and the electrical coupling to the measurement device is less than 1 kΩ, preferably less than 100Ω, particularly preferably less than 10Ω.

In particular, the geometry of the suspension and the doping of the suspension are configured in combined fashion such that the suspension is sufficiently stable and also has as low an electrical resistance as possible.

In accordance with a further development, the measurement device is configured to excite the optical component and the electrodes, which are connected to the optical component, with an excitation signal having a predetermined excitation frequency and a predetermined voltage value of greater than 3.3 V and less than or equal to 20 V and to subsequently sample them with the sampling frequency, with the excitation frequency being equal to the sampling frequency.

By configuring the excitation signal with an increased voltage value, the influence of EUV-based disturbances for the measurement signal is reduced.

In accordance with a further development, the predetermined voltage value of the excitation signal is between 6.6 V and 20 V, preferably between 6.6 V and 15 V.

In accordance with a further development, the optical component has a first layer and a second layer, separated from the first layer by way of a dielectric, wherein the first layer is a mirror layer and the second layer is configured for electrical coupling to the capacitive sensor.

By configuring the optical component with the two separated layers it is possible to connect both separated layers to a common reference potential, for example to ground. As a result, a reduction of the influence of EUV-based disturbances is possible.

In accordance with a further development, the first layer and the second layer are each electrically coupled to a common reference potential.

In accordance with a further development, the common reference potential is ground.

In accordance with a further development, an electrical resistance of a path between the dielectric and the reference potential via the second layer and a capacitance, formed by the first layer, the dielectric and the second layer, form a high-pass filter.

The high-pass filter is in particular suited to filter out low-frequency EUV-based disturbances.

The respective unit, for example evaluation unit or extraction unit, can be implemented by way of hardware technology and/or software technology. If the implementation is based on hardware technology, the respective unit can be in the form of an apparatus or part of an apparatus, such as a computer or a microprocessor, or in the form of a control computer of a vehicle. If the implementation is based on software technology, the respective unit can be in the form of a computer program product, in the form of a function, in the form of a routine, in the form of part of a program code or in the form of an executable object.

Proposed in accordance with a further aspect is a method for operating a lithography apparatus which includes a radiation source for producing radiation having a specific repetition frequency, an optical component for guiding the radiation within the lithography apparatus, an actuator device for displacing the optical component, and a measurement device for determining a position of the optical component using a measurement signal. The measurement signal and the radiation produced by the radiation source are here temporally synchronized.

Proposed in accordance with a further aspect is a lithography apparatus which includes a radiation source for producing radiation having a specific repetition frequency, an optical component for guiding the radiation within the lithography apparatus, an actuator device for displacing the optical component, and a measurement device for determining a position of the optical component using a measurement signal having a specific measurement signal frequency. The measurement device has a capacitive sensor for measuring the position of a tilt angle of the optical component, wherein the electrodes of the capacitive sensor are in the shape of a comb and arranged in intermeshed fashion. Here, the suspension is configured such that the electrical resistance of a path between the electrode, which is connected to the optical component, of the capacitive sensor, the optical component, the suspension and the electrical coupling to the measurement device is less than 1 kΩ, preferably less than 100Ω, particularly preferably less than 10Ω.

In accordance with a further development, the suspension for mounting the optical component is produced from a doped semiconductor material, for example from a doped polysilicon.

In accordance with a further development, the suspension is configured in terms of its geometry such that the electrical resistance of a path between the electrode, which is connected to the optical component, of the capacitive sensor, the optical component, the suspension and the electrical coupling to the measurement device is less than 1 kΩ, preferably less than 100Ω, particularly preferably less than 10Ω.

Proposed in accordance with a further aspect is a lithography apparatus which includes a radiation source for producing radiation having a specific repetition frequency, an optical component for guiding the radiation within the lithography apparatus, an actuator device for displacing the optical component, and a measurement device for determining a position of the optical component using a measurement signal having a specific measurement signal frequency. The measurement device has a capacitive sensor for measuring the position of a tilt angle of the optical component, wherein the electrodes of the capacitive sensor are in the shape of a comb and arranged in intermeshed fashion. Here, the measurement device is configured to excite the optical component and the electrodes, which are connected to the optical component, with an excitation signal having a predetermined excitation frequency and a predetermined voltage value of between greater than 3.3 V and less than or equal to and to subsequently sample them with the sampling frequency, with the excitation frequency being equal to the sampling frequency.

In accordance with a further development, the predetermined voltage value of the excitation signal is between 6.6 V and 20 V, preferably between 6.6 V and 15 V.

Proposed in accordance with a further aspect is a lithography apparatus which includes a radiation source for producing radiation having a specific repetition frequency, an optical component for guiding the radiation within the lithography apparatus, an actuator device for displacing the optical component, and a measurement device for determining a position of the optical component using a measurement signal having a specific measurement signal frequency. The measurement device has a capacitive sensor for measuring the position of a tilt angle of the optical component. Here, the optical component has a first layer and a second layer, separated from the first layer by way of a dielectric, wherein the first layer is a mirror layer and the second layer is configured for electrical coupling to the capacitive sensor.

In accordance with a development, the first layer and the second layer are each electrically coupled to a common reference potential. The common reference potential is ground, for example.

In accordance with a further development, an electrical resistance of a path between the dielectric and the reference potential via the second layer and a capacitance, formed by the first layer, the dielectric and the second layer, form a high-pass filter.

Proposed in accordance with a further aspect is a lithography apparatus which includes a continuously switched-on radiation source for producing radiation having a specific repetition frequency, an optical component for guiding the radiation within the lithography apparatus, an actuator device for displacing the optical component, a measurement device for determining a position of the optical component using a measurement signal having a specific measurement signal frequency, and an apparatus for opening and interrupting the optical path that is arranged downstream of the optical component in the optical path of the lithography apparatus.

In accordance with a development, the lithography apparatus has a shutter device which includes the apparatus for opening and interrupting the optical path.

Proposed in accordance with a further aspect is a lithography apparatus which includes a radiation source, which is periodically switched on at specific switch-on times, for producing radiation having a specific repetition frequency, an optical component for guiding the radiation within the lithography apparatus, an actuator device for displacing the optical component, a measurement device for determining a position of the optical component using a measurement signal having a specific measurement signal frequency, and a voltage source, coupled to the optical component, for emulating disturbance pulses, which are produced at the optical component by the by the radiation of the radiation source at the specific switch-on times, outside the specific switch-on times.

In accordance with a development, the voltage source is configured to emulate the disturbance pulses outside the specific switch-on times with the specific repetition frequency of the radiation source.

Furthermore proposed is a computer program product which initiates the operation of a lithography apparatus of the method as explained above on a program-controlled device in a manner such that the measurement signal and the radiation produced by the radiation source are temporally synchronized.

Further possible implementations of the disclosure also include not explicitly mentioned combinations of features or embodiments that are described above or below with respect to the exemplary embodiments. In this respect, a person skilled in the art will also add individual aspects to the respective basic form of the disclosure as improvements or additions.

Further advantageous configurations and aspects of the disclosure are the subject of the dependent claims and also of the exemplary embodiments of the disclosure described below.

BRIEF DESCRIPTION OF THE DRAWINGS

In the text that follows, the disclosure is explained in more detail on the basis of preferred embodiments with reference to the accompanying figures.

DETAILED DESCRIPTION

Identical elements or elements having an identical function have been provided with the same reference signs in the figures, provided nothing else is indicated. It should also be noted that the illustrations in the figures are not necessarily to scale.

Figure 1:
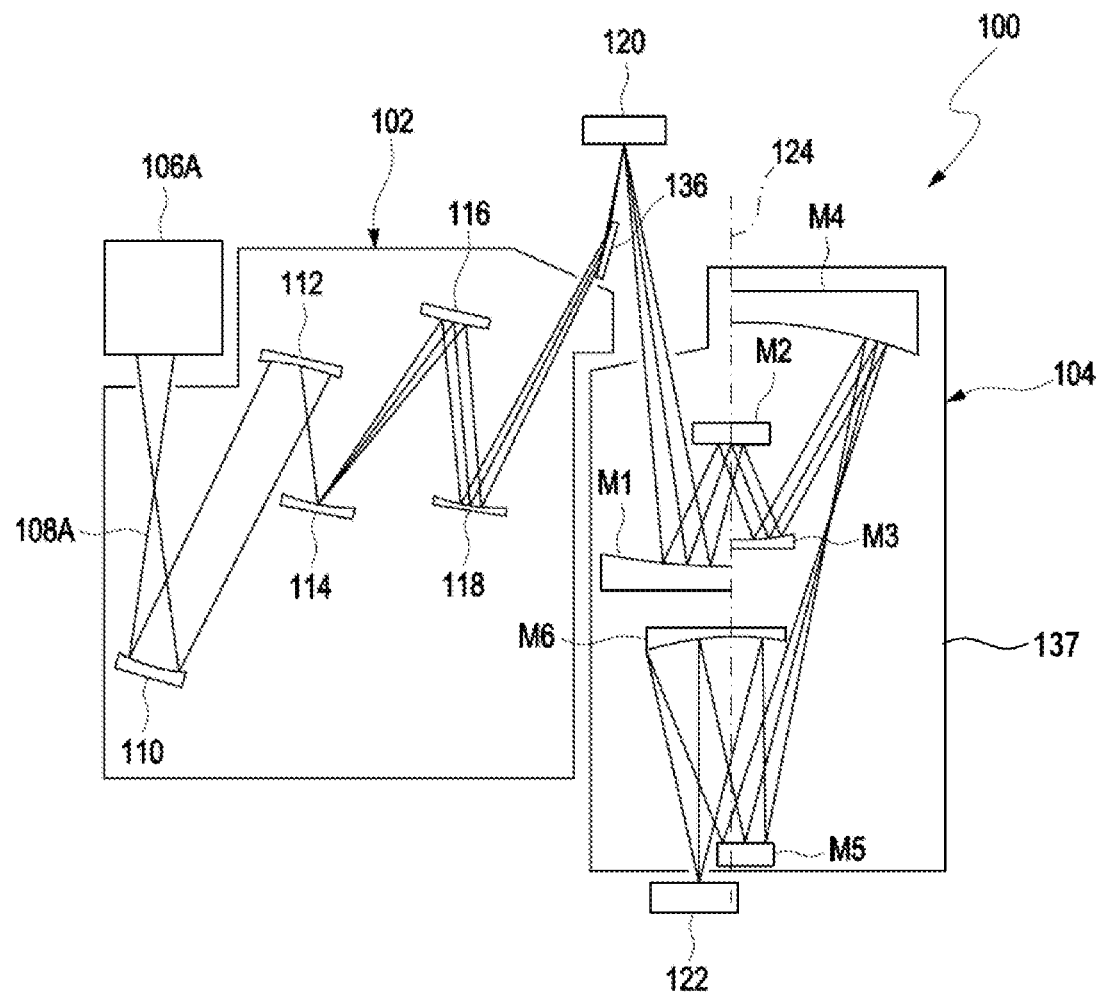
FIG. 1 shows a schematic view of an EUV lithography apparatus.

FIG. 1 shows a schematic view of an EUV lithography apparatus 100, which includes a beam-shaping and illumination system 102 and a projection system 104. EUV stands for "extreme ultraviolet" and refers to a wavelength of the operating light of between 0.1 and 30 nm. The beam-shaping and illumination system 102 and the projection system 104 are respectively provided in a vacuum housing, each vacuum housing being evacuated with the aid of an evacuation apparatus that is not represented more specifically. The vacuum housings are surrounded by a machine room not illustrated in any more detail. Electrical controllers and the like can also be provided in this machine room.

The EUV lithography apparatus 100 includes an EUV radiation source or EUV light source 106A. A plasma source which emits radiation 108A in the EUV range (extreme ultraviolet range), that is to say for example in the wavelength range of 5 nm to 30 nm, may for example be provided as the EUV light source 106A. In the beam-shaping and illumination system 102, the EUV radiation 108A is focused and the desired operating wavelength is filtered out from the EUV radiation 108A. The EUV radiation 108A produced by the EUV light source 106A has a relatively low transmissivity through air, for which reason the beam guiding spaces in the beam-shaping and illumination system 102 and in the projection system 104 are evacuated.

The beam-shaping and illumination system 102 illustrated in FIG. 1 has five mirrors 110, 112, 114, 116, 118. After passing through the beam-shaping and illumination system 102, the EUV radiation 108A is directed onto the photomask (reticle) 120. The photomask 120 is likewise formed as a reflective optical element and can be arranged outside the systems 102, 104. Furthermore, the EUV radiation 108A can be directed onto the photomask 120 via a mirror 136. The photomask 120 has a structure which is imaged onto a wafer 122 or the like in a reduced fashion via the projection system 104.

The projection system 104 has six mirrors M1-M6 for imaging the photomask 120 onto the wafer 122. In this case, individual mirrors M1-M6 of the projection system 104 may be arranged symmetrically in relation to the optical axis 124 of the projection system 104. It should be noted that the number of mirrors of the EUV lithography apparatus 100 is not restricted to the number represented. A greater or lesser number of mirrors can also be provided. Furthermore, the mirrors M1-M6 are generally curved on their front side for beam shaping.

Figure 2:
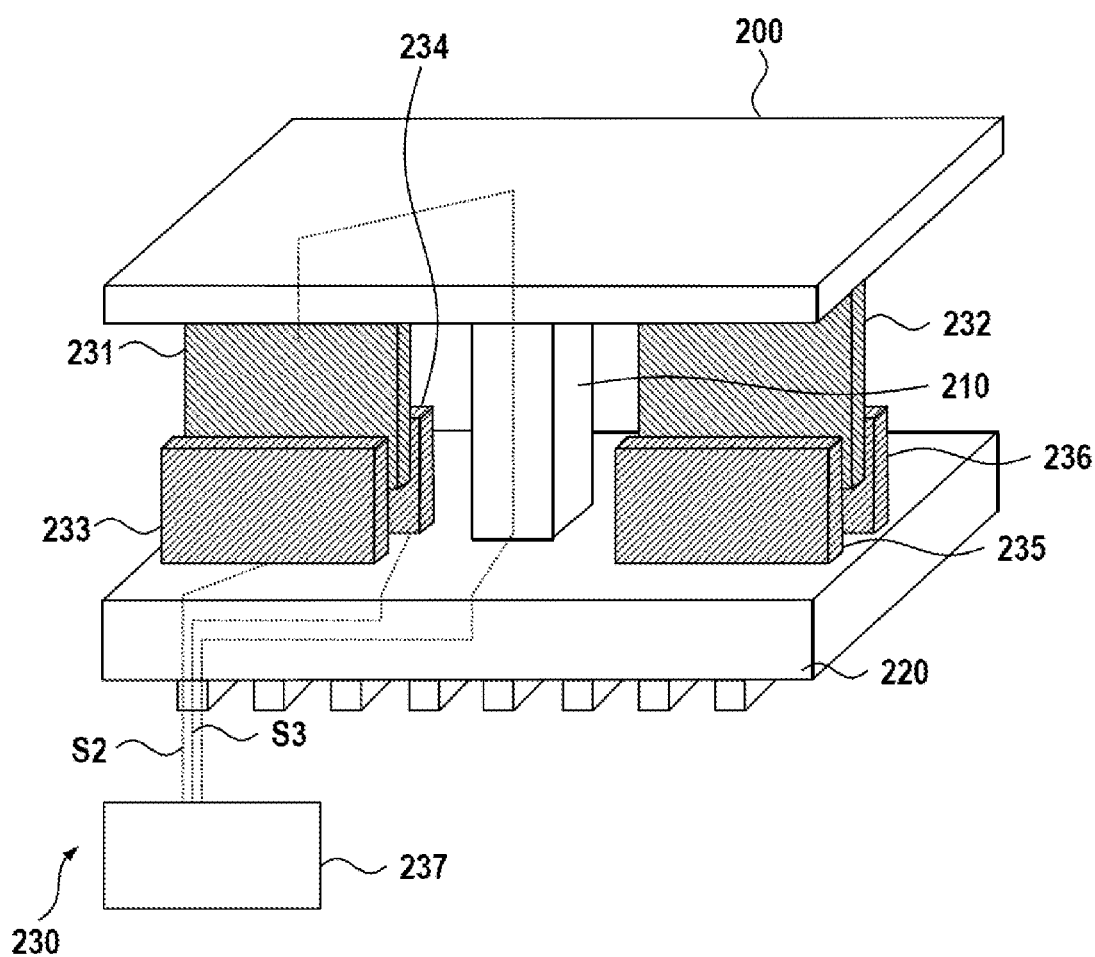
FIG. 2 shows a schematic view of a first embodiment of an aspect of the EUV lithography apparatus.

FIG. 2 shows a schematic view of a first embodiment of an aspect of the EUV lithography apparatus 100.

FIG. 2 illustrates a mirror 200 as an optical component and a measurement device 230 that is assigned to the mirror 200. The mirror 200 can be in the form of an individual mirror or as a MEMS mirror and, for example, be part of one of the mirrors 110, 112, 114, 116, 118 of the beam-shaping and illumination system 102 of the EUV lithography apparatus 100 from FIG. 1. The individual mirror 200 in FIG. 2 can also be part of one of the further mirrors M1-M6 of the EUV lithography apparatus 100 in FIG. 1.

FIG. 2 furthermore illustrates that the mirror 200 is connected to a base plate 220 by way of a suspension 210. The suspension 210 is part of an actuator device 210 (not illustrated in more detail) for displacing the mirror 200. Details of an example of such an actuator device 210 can be gathered from the document DE 10 2013 209 442 A1.

The measurement device 230 is configured for determining a position of the mirror 200 using a measurement signal S2 having a specific measurement signal frequency f2. The measurement signal frequency f2 is, for example, a sampling frequency. The measurement device 230 is here preferably configured to excite the mirror 200 and the sensor electrodes 231-236, which are connected to the mirror 200, with an excitation signal S3 having a predetermined excitation frequency f3 and to subsequently sample them with the sampling frequency f2. The excitation frequency f3 is in particular equal to the sampling frequency f2. Alternatively, the sampling frequency f2 can also be higher than the excitation frequency f3. The measurement signal frequency f2 is unequal to the repetition frequency f1 and unequal to integer multiples of the repetition frequency f1. Consequently, the measurement signal frequency f2 is unequal to the repetition frequency f1 of the EUV radiation source 106A and the frequencies of the harmonic thereof. In FIG. 2, the line S4 is connected to a reference potential, for example to ground. To this end, the measurement device 230 has a number of electrodes 231-236 which are in the shape of a comb and arranged in intermeshed fashion. As a result, the measurement device 230 forms a capacitive sensor for determining the position of a tilt angle of the mirror 200. The electrodes or sensor electrodes 231-236 are connected to an evaluation unit 237 by way of electric lines. The evaluation unit 237 is configured to excite the mirror 200 and the sensor electrodes 231-236, which are connected to the mirror 200, with the excitation signal S3 and to receive and evaluate the resulting measurement signal S2. The evaluation unit 237 can be implemented as a software product and be part of a central controller of the lithography apparatus 100.

When selecting the measurement signal frequency f2, in particular the following condition applies: $|f2-n\cdot f1|>B$.

Figure 3:
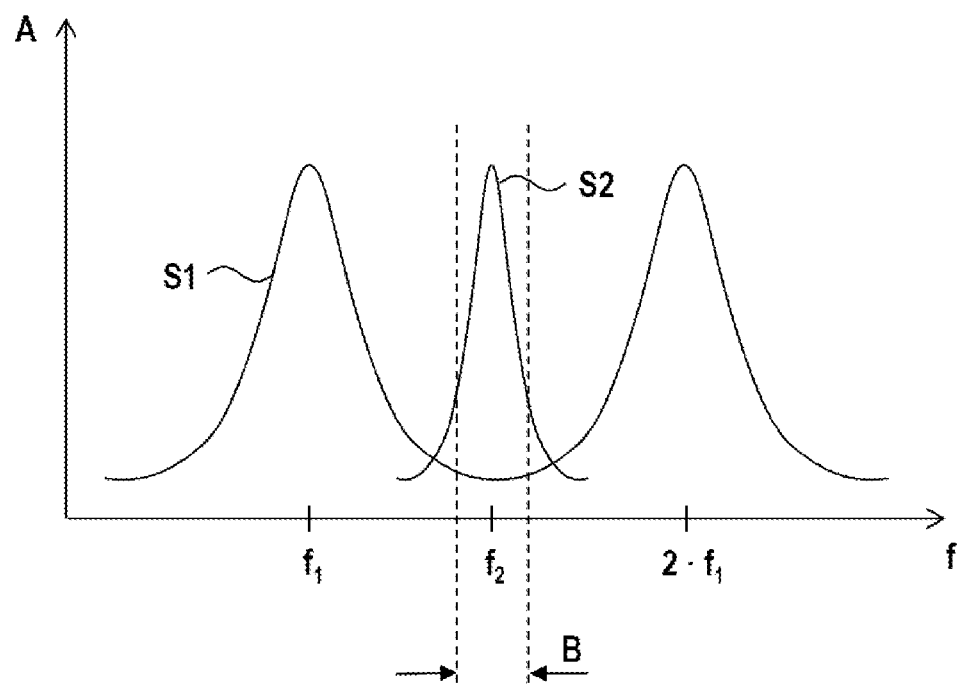
FIG. 3 shows a schematic for illustrating an example of the EUV radiation and the measurement signal.

In particular, in each case a specific bandwidth B is provided between the measurement signal frequency f2 and the repetition frequency f1 and between the measurement signal frequency f2 and a respective integer multiple of the repetition frequency f1. In this respect, FIG. 3 shows a schematic for illustrating an example of the EUV radiation S1 and the measurement signal S2. The curve for the EUV radiation S1 shows, by way of example, two maxima at the repetition frequency f1 and at $2\cdot f1$ (n=2). The measurement signal frequency f2 is selected, in accordance with FIG. 3, such that it is exactly between the frequencies f1 and $2\cdot f1$. The bandwidth B, which is also shown in FIG. 3, around the measurement signal frequency f2 is for example 5 kHz, 10 kHz or 20 kHz.

Furthermore, the measurement signal frequency f2 is not only unequal to the repetition frequency f1 and unequal to the integer multiples of the repetition frequency f1, for example $2\cdot f1$, but also less than a maximum cut-off frequency for the measurement signal frequency f2. The maximum cut-off frequency for the measurement signal frequency f2 depends on the application and is, for example, 10 MHz.

Figure 4:
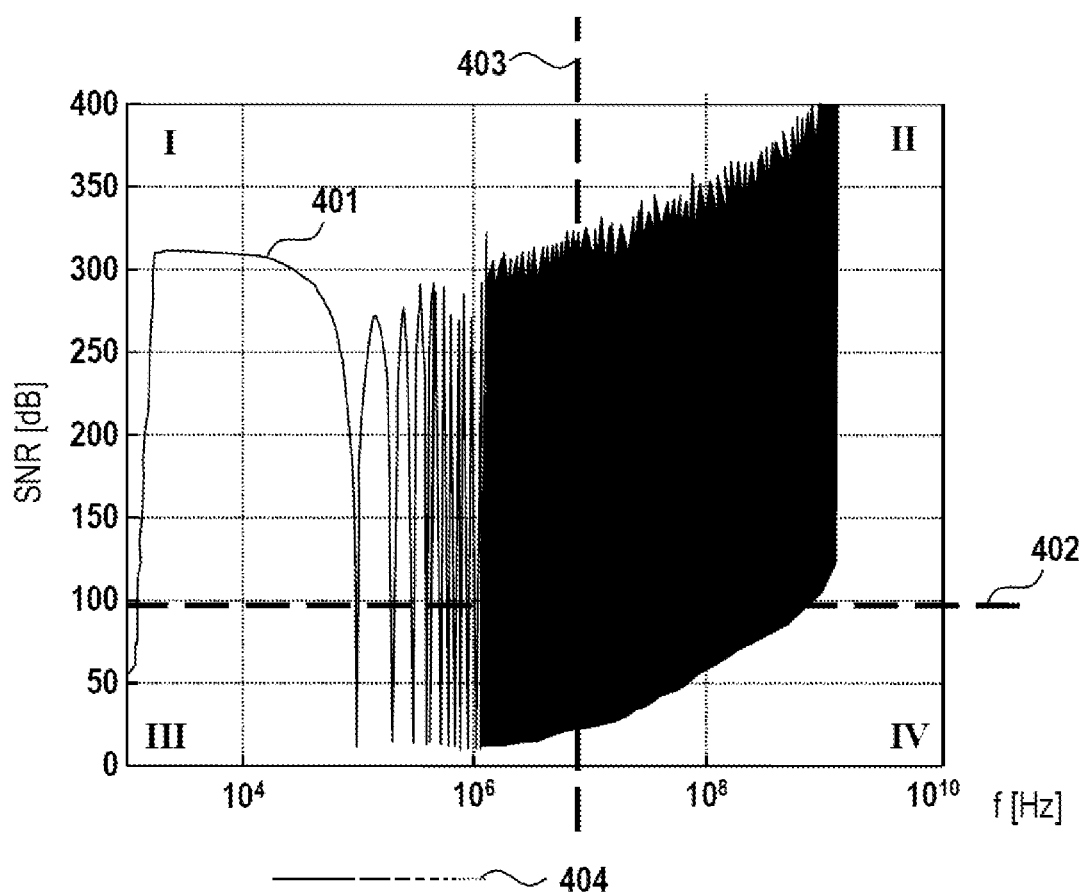
FIG. 4 shows a schematic for illustrating the signal-to-noise ratio for the measurement signal in an exemplary implementation of radiation source and measurement device of the EUV lithography apparatus.

In this respect, FIG. 4 shows a diagram for illustrating the signal-to-noise ratio (SNR) for the measurement signal S2 in an exemplary implementation of radiation source 106A and measurement device 230. The x-axis in FIG. 4 here shows the frequency in Hertz in a logarithmic scale, while the y-axis shows the signal-to-noise ratio SNR in dB.

The curve 401 in FIG. 4 shows the SNR of the measurement signal S2, the curve 402 shows an application-specific lower limit for the SNR, the curve 403 shows a maximum cut-off frequency of the excitation signal S3. The lower limit 402 of the SNR is application-specific and is, for example, 98 dB. The lines 402 and 403 divide the diagram in FIG. 4 into four quadrants I, II, III and IV.

With respect to the selection of the measurement signal frequency f2, the line 404 shows possible values for the measurement signal frequency f2. In other words, the line 404 illustrates values for the measurement signal frequency f2 for which only those values result for the SNR 401 that are in the first quadrant I in FIG. 4.

Figure 5:
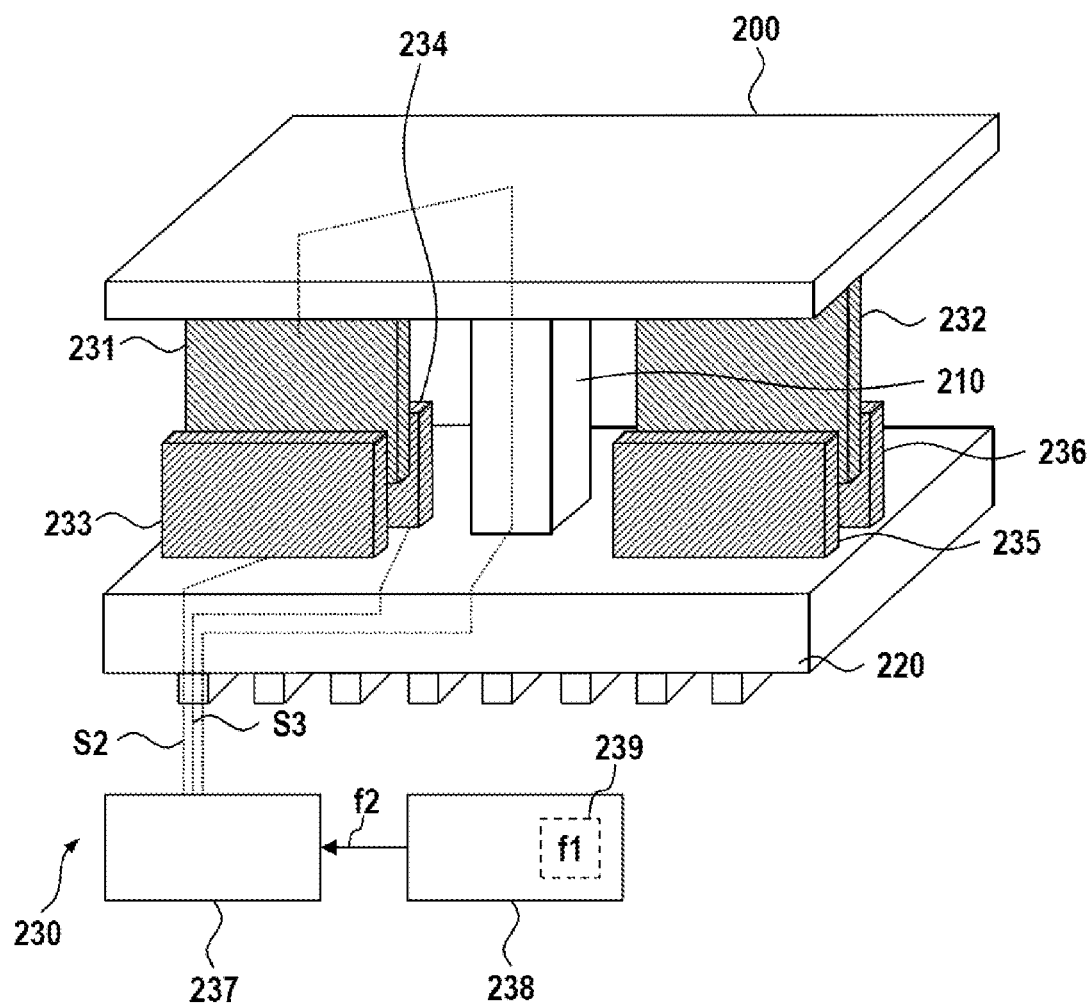
FIG. 5 shows a schematic view of a second embodiment of an aspect of the EUV lithography apparatus.

FIG. 5 shows a schematic view of a second embodiment of an aspect of an EUV lithography apparatus 100 of FIG. 1.

The second embodiment in FIG. 5 is based on the first embodiment in FIG. 2 and has all the features of the first embodiment in FIG. 2. In addition, FIG. 5 shows that a setting device 238 is provided. The setting device 238 is configured to set the measurement signal frequency f2 in dependence on the repetition frequency f1.

In the case that the repetition frequency f1 of the EUV radiation source 106A is fixed, a memory device 239 may be provided that stores this value of the repetition frequency f1 and provides it to the setting device 238. This memory device 239 can also be part of the setting device 238.

In the case that the repetition frequency f1 is variable, the current value of the repetition frequency f1 can be provided to the setting device 238 for example using a determination device (not illustrated), which is configured to measure the current value of the repetition frequency f1.

In the case that the repetition frequency f1 is variable, the setting device 238 can be configured to set the measurement signal frequency f2 in dependence on the variable repetition frequency f1. In other words, the setting device 238 can be configured to adjust the measurement signal frequency f2 in accordance with the repetition frequency f1.

Figure 6:
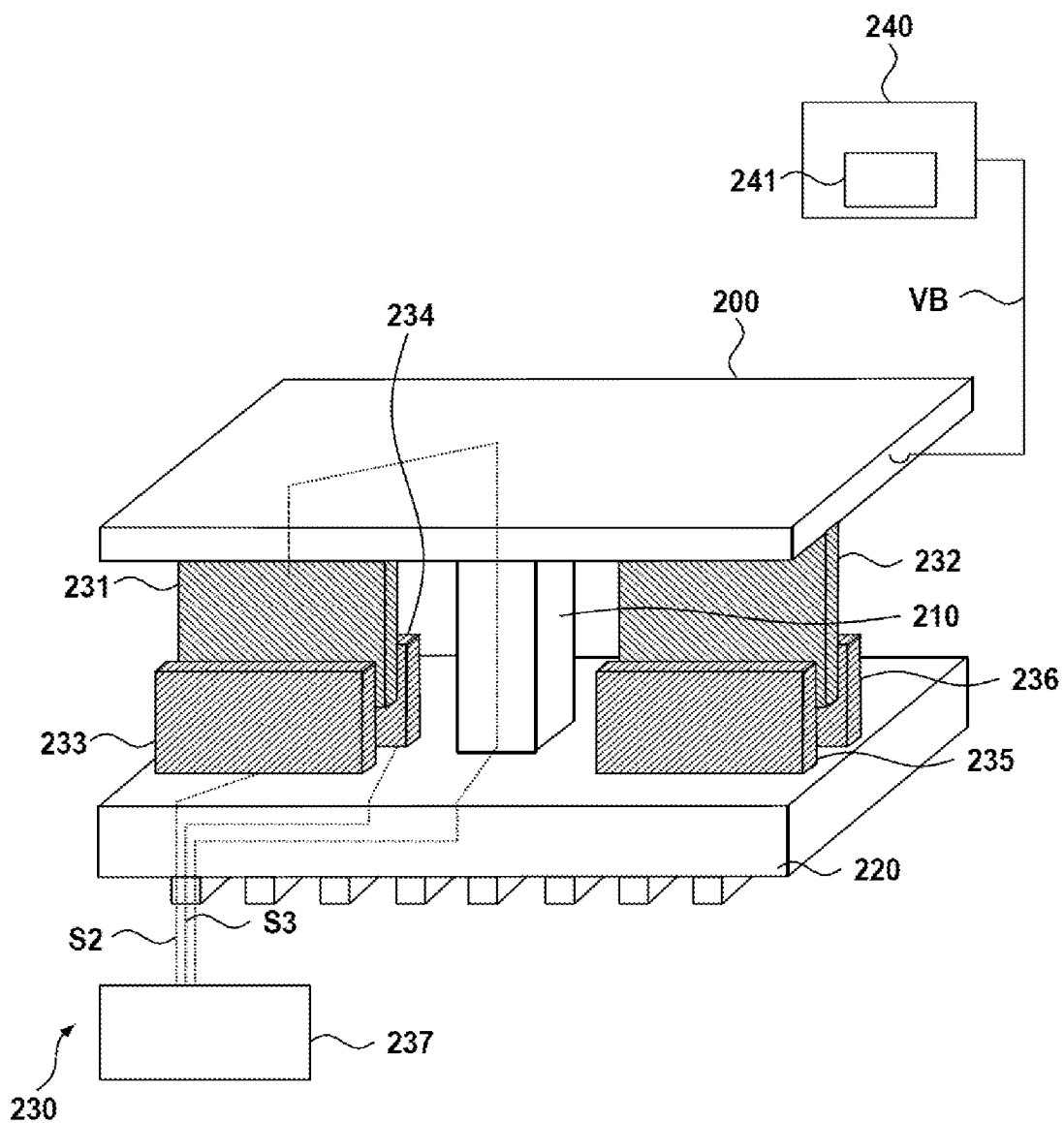
FIG. 6 shows a schematic view of a third embodiment of an aspect of the EUV lithography apparatus.

FIG. 6 shows a schematic view of a third embodiment of an aspect of the EUV lithography apparatus 100.

The third embodiment in FIG. 6 is based on the first embodiment in FIG. 2 and has all the features of the first embodiment in FIG. 2. Additionally, a control device 240 is provided in the third embodiment in FIG. 6. The control device 240 is configured to apply electrical bias potential VB to the mirror 200. To this end, the control device 240 can have a look-up table 241. The bias potential VB that is to be applied to the mirror 200 can be determined using the look-up table 241. The control device 240 can also be in the form of a closed-loop control device with at least one sensor (not illustrated). Details in this respect can be found from the reference document DE 10 2013 209 442 A1.

Figure 7:
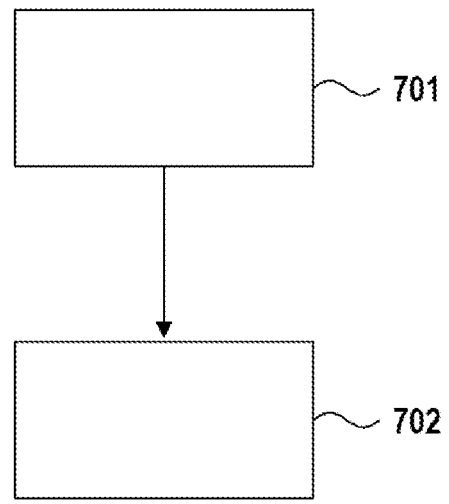
FIG. 7 shows a first embodiment of a method for operating an EUV lithography apparatus.

FIG. 7 illustrates an embodiment of a method for operating a lithography apparatus 100. Examples and aspects of such a lithography apparatus 100 are illustrated in FIGS. 1 to 6. The lithography apparatus 100 includes at least one radiation source 106A for producing radiation having a specific repetition frequency f1, an optical component 200, for example a mirror or individual mirror, for guiding the radiation within the lithography apparatus 100, an actuator device 210 for displacing the optical component 200, and a measurement device 230 for determining a position of the optical component 200.

The method of FIG. 7 includes the steps 701 and 702:

In step 701, a measurement signal frequency f2 for a measurement signal S2, by way of which the measurement device 230 can determine the position of the optical component 200, is selected such that the measurement signal frequency f2 is unequal to the repetition frequency f1 of the radiation source 106A and unequal to integer multiples of the repetition frequency f1.

In step 702, the position of the optical component 200 is determined by the measurement device 210 on the basis of the measurement signal S2 having the selected measurement signal frequency f2.

Figure 8:
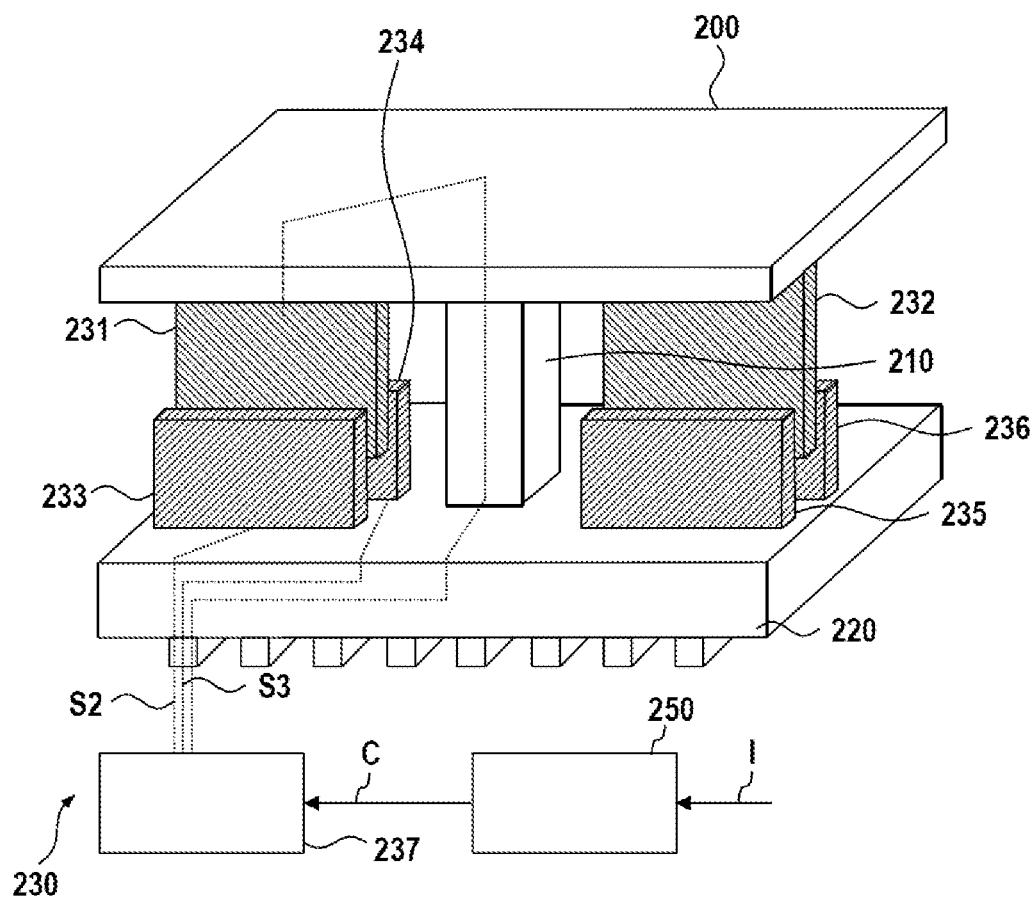
FIG. 8 shows a schematic view of a fourth embodiment of an aspect of the EUV lithography apparatus.

FIG. 8 shows a schematic view of a fourth embodiment of an aspect of the EUV lithography apparatus 100. FIG. 8 illustrates a mirror 200 as an optical component and a measurement device 230 that is assigned to the mirror 200. The measurement device 230 is configured in particular as described with respect to FIG. 2. The mirror 200 can be in the form of an individual mirror or as a MEMS mirror and, for example, be part of one of the mirrors 110, 112, 114, 116, 118 of the beam-shaping and illumination system 102 of the EUV lithography apparatus 100 from FIG. 1. The individual mirror 200 in FIG. 8 can also be part of one of the further mirrors M1-M6 of the EUV lithography apparatus 100 in FIG. 1.

FIG. 8 furthermore illustrates that the mirror 200 is connected to a base plate 220 by way of a suspension 210. The suspension 210 is part of an actuator device 210 (not illustrated in more detail) for displacing the mirror 200. Details of an example of such an actuator device 210 can be gathered from the document DE 10 2013 209 442 A1.

The lithography apparatus 100 in accordance with FIG. 8 furthermore includes a synchronization device 250. The synchronization device 250 receives instantaneous information I via the radiation that is produced by the radiation source 106A and adapts the measurement signal S2 and/or the excitation signal S3 in dependence on the received instantaneous information I using a control signal C. The synchronization device 250 is therefore set up to temporally synchronize the measurement signal S2 and the rediation S1 produced by the radiation source 106A.

For example, the synchronization device 250 can be configured to adapt an amplitude of the measurement signal S2, a phase of the measurement signal S2 and/or the measurement signal frequency f2 of the measurement signal S2 in dependence on the received instantaneous information I. In dependence on the received instantaneous information I, the synchronization device 250 can also set the measurement signal frequency f2, using the control signal C, such that it is unequal to the repetition frequency f1 of the radiation source 106A and unequal to integer multiples of the repetition frequency f1.

Furthermore, the synchronization device 250 can additionally or alternatively be configured to adapt an evaluation of the measurement signal S2 in dependence on the received instantaneous information I. By way of example, the synchronization device 250 can here mask, in dependence on the received instantaneous information I, specific regions of the measurement signal S2 during the evaluation of the measurement signal S2. In this case, in particular such regions of the measurement signal S2 are masked during the evaluation that are known, owing to the instantaneous information I, to have a disturbance component above a specific limit value.

Figure 9:
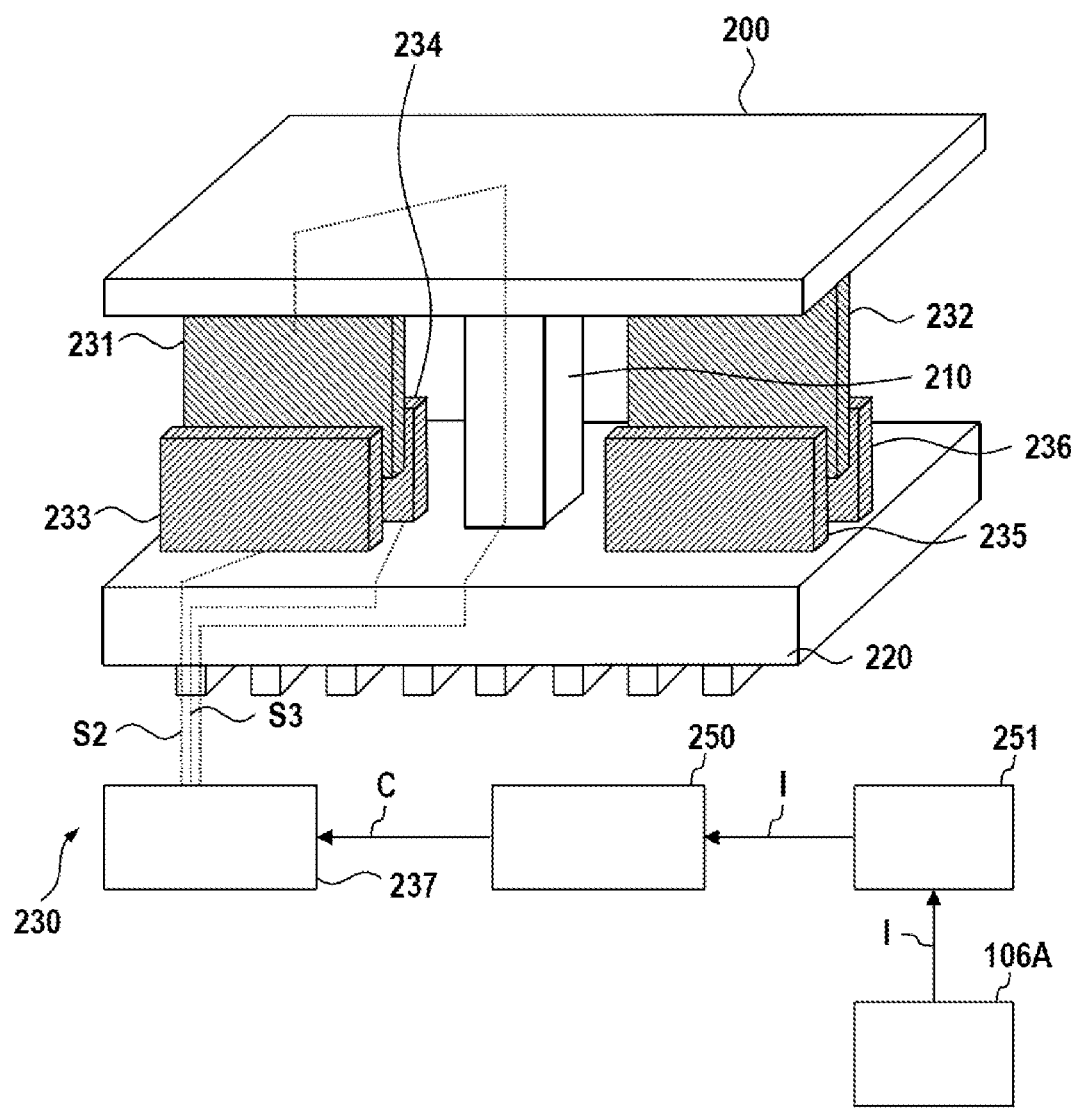
FIG. 9 shows a schematic view of a fifth embodiment of an aspect of an EUV lithography apparatus.

FIG. 9 shows a schematic view of a fifth embodiment of an aspect of an EUV lithography apparatus 100 of FIG. 1. The fifth embodiment in FIG. 9 is based on the fourth embodiment in FIG. 8 and has all the features of the fourth embodiment in FIG. 8. In addition, FIG. 9 shows that the lithography apparatus 100 has a transmission device 251. The transmission device 251 is configured to transmit the instantaneous information I relating to the radiation produced by the radiation source 106A, in particular a frequency, a phase and/or an amplitude of the radiation, from the radiation source 106A to the synchronization device 250.

Figure 10:
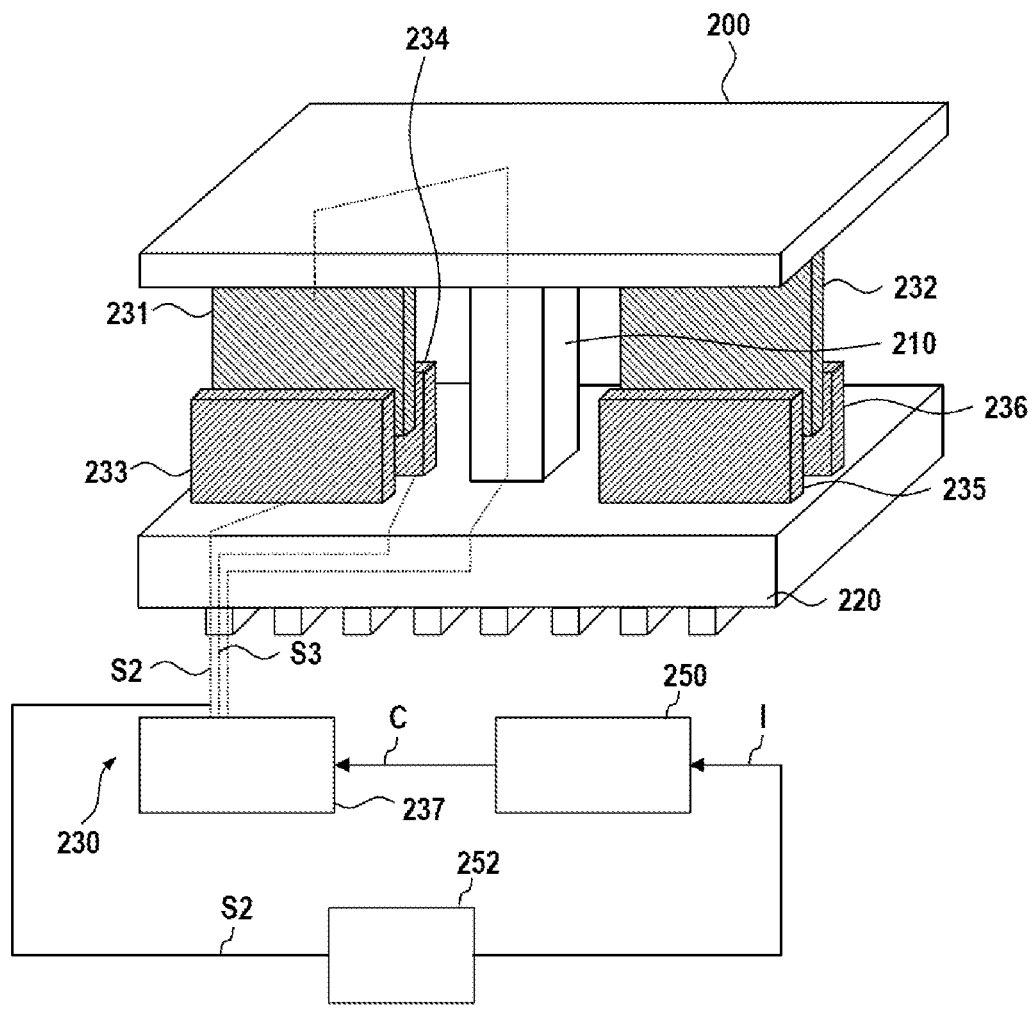
FIG. 10 shows a schematic view of a sixth embodiment of an aspect of an EUV lithography apparatus.

FIG. 10 shows a schematic view of a sixth embodiment of an aspect of an EUV lithography apparatus 100 of FIG. 1.

The sixth embodiment in FIG. 10 is based on the fourth embodiment in FIG. 8 and has all the features of the fourth embodiment in FIG. 8. In addition, FIG. 10 shows that the lithography apparatus 100 has an extraction unit 252. The extraction unit 252 is configured to extract the instantaneous information I by way of the radiation S1 produced by the radiation source 106A from a signal component, in particular a disturbance signal component, of the measurement signal S2.

Figure 11:
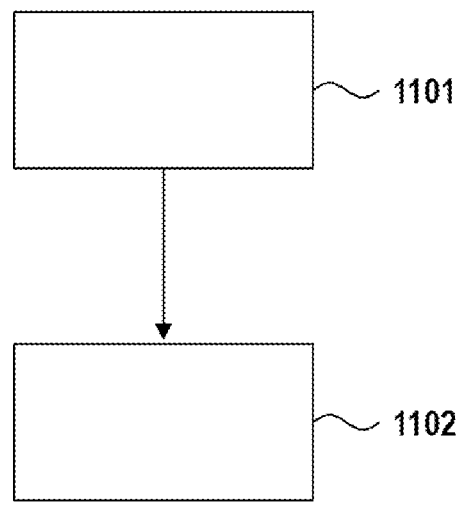
FIG. 11 shows a second embodiment of a method for operating an EUV lithography apparatus.

FIG. 11 shows a second embodiment of a method for operating an EUV lithography apparatus. The EUV lithography apparatus 100 includes a radiation source 106A for producing radiation having a specific repetition frequency f1, an optical component 200, for example a mirror or individual mirror, for guiding the radiation within the lithography apparatus 100, an actuator device 210 for displacing the optical component 200, and a measurement device 230 for determining a position of the optical component 200 using a measurement signal S2.

The method of FIG. 11 includes the steps 1101 and 1102:

In step 1101, the produced radiation S1 and the measurement signal S2 are captured or determined.

The measurement signal S2 and the radiation S1 produced by the radiation source 106A are temporally synchronized in step 1102.

Figure 12:
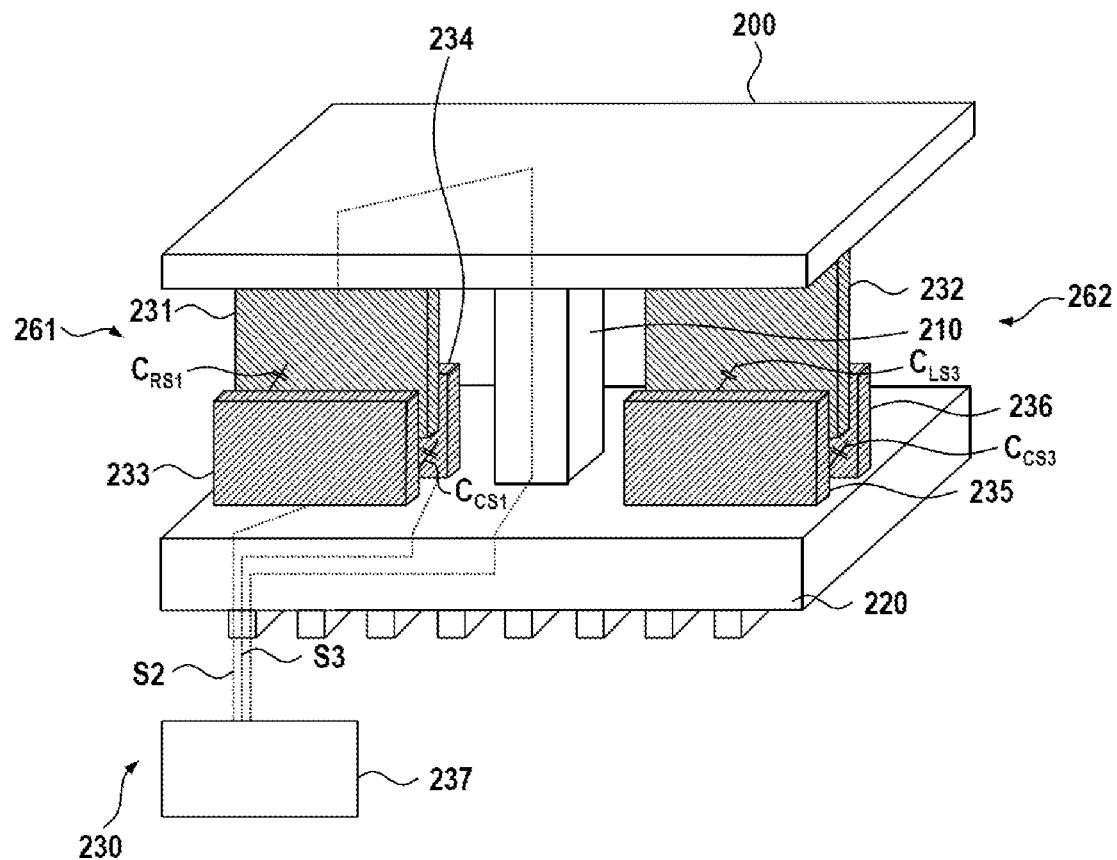
FIG. 12 shows a schematic view of a seventh embodiment of an aspect of the EUV lithography apparatus.

FIG. 12 shows a schematic view of a seventh embodiment of an aspect of the lithography apparatus 100. The seventh embodiment in FIG. 12 is based on the first embodiment in FIG. 2. FIG. 12 also shows the capacitances $C_{CS1}$, $C_{CS3}$, $C_{RS1}$, $C_{LS3}$. The capacitance $C_{CS1}$ is the capacitance between the electrodes 233 and 234. The capacitance $C_{RS1}$ is the capacitance between the electrodes 231 and 233. The capacitance $C_{CS3}$ is the capacitance between the electrodes 235 and 236. The capacitance $C_{LS3}$ is the capacitance between the electrodes 232 and 235. The electrodes 231, 233 and 234 form a comb-type first sensor device 261. The electrodes 232, 235 and 236 correspondingly form a comb-type second sensor device 262. The two sensor devices 261 and 262 form a capacitive sensor to measure the position of a tilt angle of the optical component 200. Independently of one another, each of the sensor devices 261, 261 can be used to capture a change in position of the optical component 200. Below, only the left-hand comb-like sensor device 261 will be addressed in detail.

Figure 13:
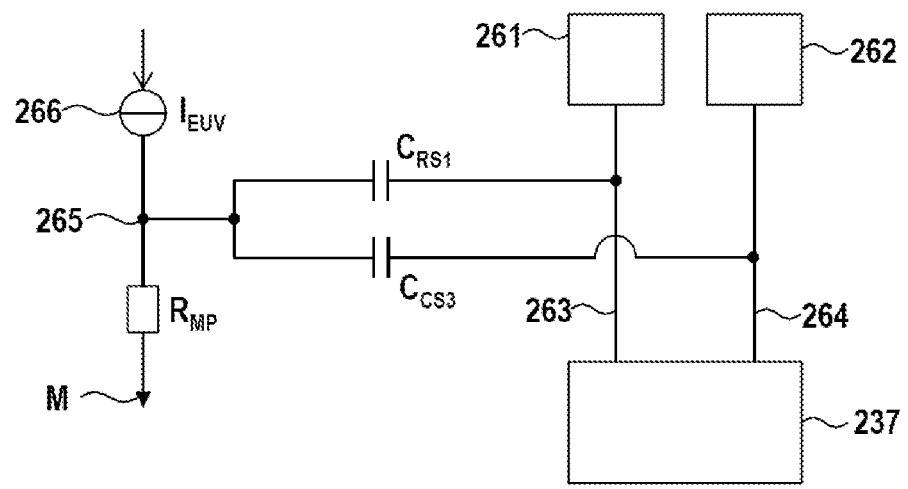
FIG. 13 shows a simplified equivalent electric circuit diagram for the arrangement in FIG. 12.

To this end, FIG. 13 shows a simplified equivalent electric circuit diagram for the arrangement in FIG. 12. The power source 266 illustrated in FIG. 13 models the current $I_{EUV}$ on the optical component 200 produced by the photons of the EUV radiation source 106 of the lithography apparatus 100. Each of the sensor devices 261, 262 is coupled to the evaluation unit 237 via an electric line 263, 264 to transmit the respective measurement signal S2.

Furthermore, the resistance $R_{MP}$ in FIG. 13 illustrates the electrical resistance of a path between the electrode 231, connected to the optical component 200, of the first sensor arrangement 261, the optical component 200, the suspension 210 and the electrical coupling to the measurement device 230 (for the left-hand sensor device 261), or the electrical resistance of the path between the electrode 232, connected to the optical component 200, of the sensor device 261, the optical component 200, the suspension 219 and the electrical coupling to the measurement device 230 (for the right-hand sensor device 262).

A node 265 is located between the resistance $R_{MP}$ and the power source 266 for providing the current $I_{EUV}$. The node 265 is coupled to the line 263 by the capacitance $C_{RS1}$. Furthermore, the node 265 is coupled to the line 264 by the capacitance $C_{LS3}$.

FIG. 13 here illustrates that a resistance $R_{MP}$ that is as low as possible is suitable to reduce the current-to-voltage conversion on the optical component 200 and thus to minimize disturbances, caused by the photons of the EUV radiation source 106A, in all frequency ranges.

One aspect of the electrical resistance $R_{MP}$ or its resistance value is the configuration of the suspension 210. In the present case, the suspension 210 is produced preferably from a doped polysilicon, with the result that a low or minimum electrical resistance $R_{MP}$ can be established. In particular, the suspension 2010 is doped such that the electrical resistance $R_{MP}$ of the path between the electrode 231, connected to the optical component 200, of the first sensor device 261, the optical component 200, the suspension 210 and the electrical coupling to the measurement device 230 and also the electrical resistance $R_{MP}$ of the path between the electrode 232, connected to the optical component 200, of the second sensor device 262, the optical component 200, the suspension 210 and the electrical coupling to the measurement device 230 is less than 1 kΩ, preferably less than 100Ω, with particular preference less than 10Ω.

Figure 14:
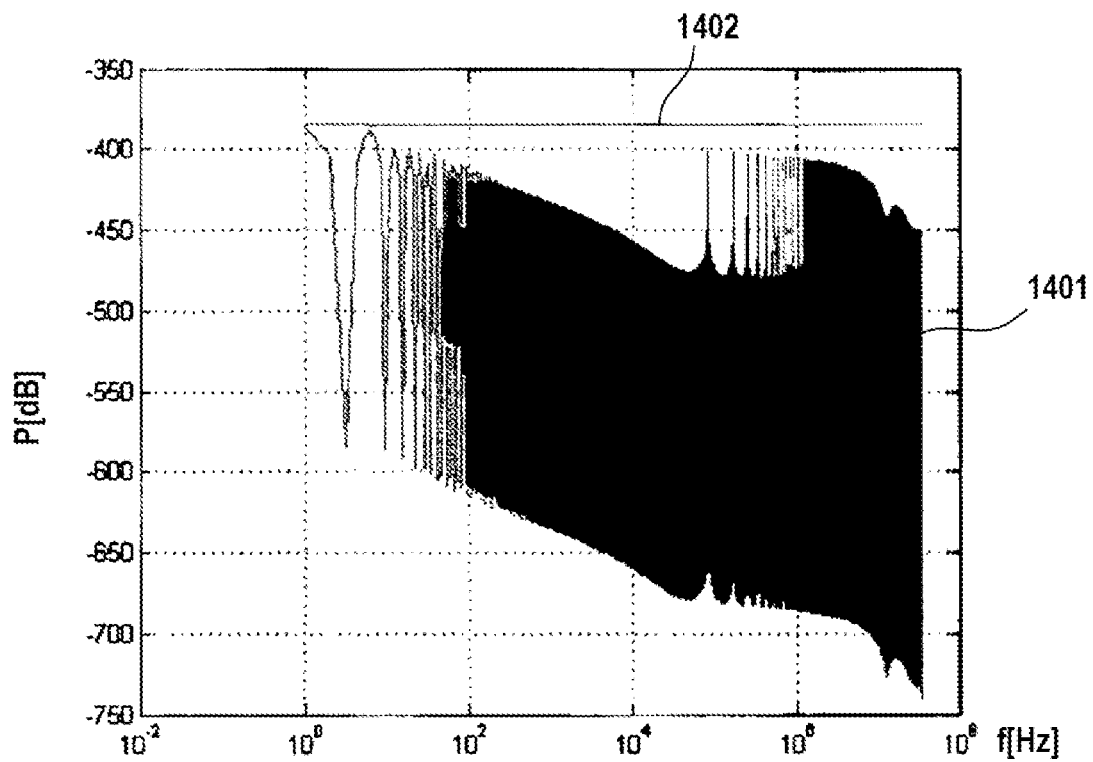
FIG. 14 shows a schematic for illustrating the power density spectrum of a disturbance of the measurement signal, due to EUV, at a resistance $R_{MP}$ of 10 $\Omega$.

To this end, FIG. 14 shows a schematic for illustrating the power density spectrum 1401 of a disturbance of the measurement signal S2, due to EUV, at a resistance $R_{MP}$ of 10Ω. As FIG. 14 shows, the power density spectrum 1401 of the EUV-based disturbance of the measurement signal S2 is reduced such that it is below a specification-specific upper limit 1402.

An eighth embodiment of an aspect of the lithography apparatus 100 can be gathered from the seventh embodiment in FIG. 12 from the fact that the optical component 200 is formed with a first layer and a second layer, which is separated from the first layer by a dielectric. The first layer is here in particular a mirror layer, and the second layer is configured for electrical coupling to the capacitive sensor, in particular to the electrodes 231, 232. The first layer and the second layer of the optical component 200 are electrically coupled in particular in each case to a common reference potential. The common reference potential is ground, for example.

Figure 15:
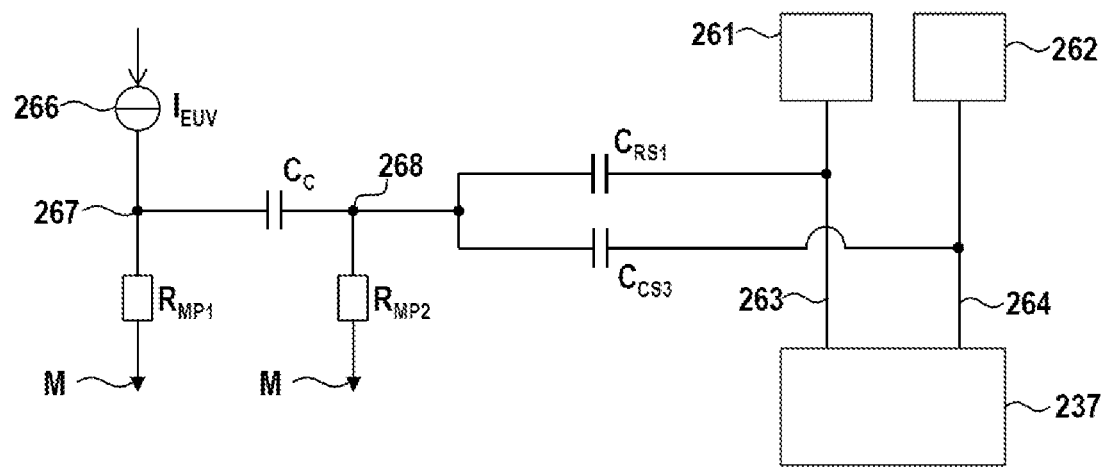
FIG. 15 shows a simplified equivalent electric circuit diagram for an eighth embodiment of an aspect of the EUV lithography apparatus.

To this end, FIG. 15 shows a simplified equivalent electronic circuit diagram for the eighth embodiment of the arrangement based on FIG. 12 and the formation of the optical component with two separate layers. In FIG. 15, $R_{MP1}$ designates the electrical resistance of the path between the dielectric, electrically depicted in FIG. 15 by way of the coupling capacitance $C_C$, the suspension 210 and the electrical coupling to the measurement device 230. Accordingly, the electrical resistance $R_{MP2}$ in FIG. 15 models the electrical resistance of the path between the second layer of the optical component 200, the suspension 210 and the electrical coupling to the measurement device 230. FIG. 15 here illustrates that the coupling capacitance Cc and the electrical resistance $R_{MP2}$ form a high-pass filter. The high-pass filter is in particular suited to filter out low-frequency EUV-based disturbances.

Figure 16:
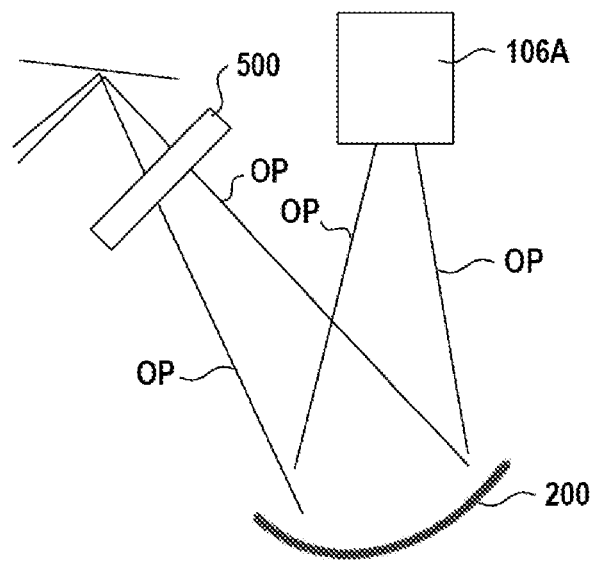
FIG. 16 shows a schematic view of a ninth embodiment of an aspect of the EUV lithography apparatus.

FIG. 16 shows a schematic view of a ninth embodiment of an aspect of the lithography apparatus 100. In the ninth embodiment of the lithography apparatus 100 in FIG. 16, the lithography apparatus is continuously switched on or is operating continuously and produces radiation having a specific repetition frequency f1. The optical component 200 in FIG. 16 is configured to guide the radiation within the lithography apparatus 100 in accordance with a predetermined optical path OP. In addition, the lithography apparatus 100 includes an actuator device 210 for displacing the optical component 200 (not illustrated in FIG. 16), and a measurement device 230 for determining a position of the optical component 200 using a measurement signal S2 having a specific measurement signal frequency f2 (not illustrated in FIG. 16).

In accordance with FIG. 16, an apparatus 500 for opening and interrupting the optical path is arranged downstream of the optical component 200 in the optical path OP of the lithography apparatus 100. The apparatus 500 has the function of opening and interrupting the optical path OP in accordance with a predetermined frequency, for example 6 Hz, and thus providing radiation having the specific repetition frequency f1, which is switched on and switched off in accordance with the predetermined frequency of 6 Hz, to the exit of the apparatus 500. Here, the apparatus 500 assumes the function of on-off keying. By using the apparatus 500, the radiation source 106A can remain continuously switched on, with the result that the optical component 200 and the measurement device 230, which is coupled to the optical component 200, see the continuous radiation of the continuously switched-on radiation source 106A and low-frequency components in the power density spectrum will thus not occur. By way of example, the apparatus 500 for opening and interrupting the optical path OP is integrated in a shutter device (not illustrated).

Figure 17:
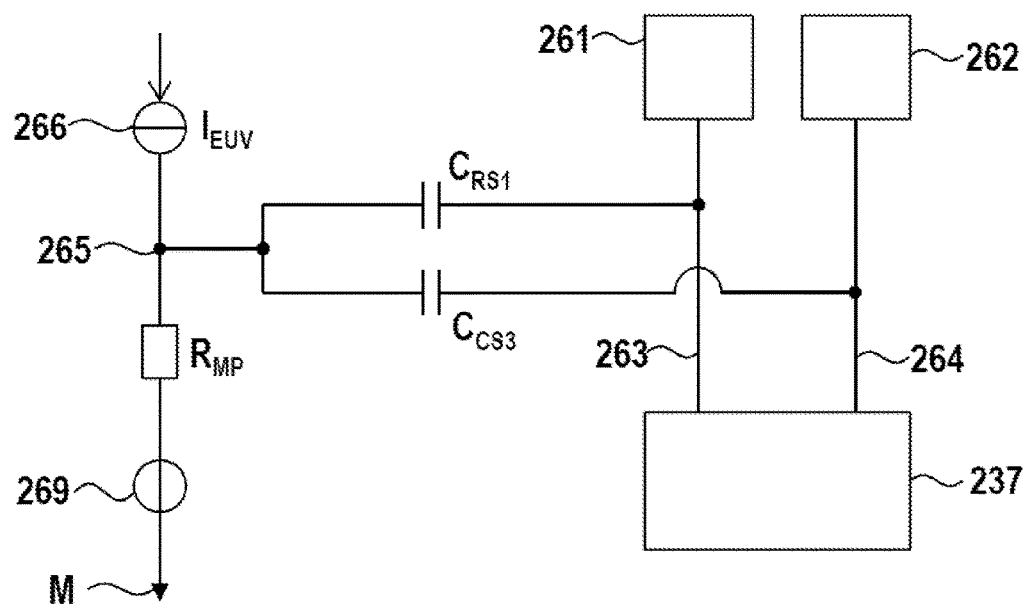
FIG. 17 shows a simplified equivalent electric circuit diagram for a tenth embodiment of an aspect of the EUV lithography apparatus.

A tenth embodiment of an aspect of the lithography apparatus 100 can be gathered from the ninth embodiment in accordance with FIG. 16 in that the radiation source 106A is periodically switched on only at specific switch-on times. In this embodiment, a voltage source 269 is coupled to the optical component 200. FIG. 17 in this respect shows a simplified equivalent electronic circuit diagram. The equivalent electronic circuit diagram in FIG. 17 is based on the equivalent electronic circuit diagram of FIG. 13 and additionally includes the voltage source 269, which is coupled between resistance $R_{MP}$ and ground M. The voltage source 269 is configured to emulate the disturbance pulses, which are produced at the optical component 200 by the by radiation from the radiation source 106A at the specific switch-on times, outside the determined switch-on time. As a result, the measurement device 230, which is coupled to the optical component 200, sees a disturbance spectrum corresponding to FIG. 16, with the result that low-frequency components in the power density spectrum will not occur here either. In particular, the voltage source 269 is configured here to emulate the disturbance pulses outside the specific switch-on times with the specific repetition frequency f1 of the radiation source 106A.

Although the present disclosure has been described on the basis of exemplary embodiments, it is modifiable in diverse ways.

LIST OF REFERENCE SIGNS

100 Lithography apparatus
100A EUV lithography apparatus
102 Beam-shaping and illumination system
104 Projection system
106A Radiation source, EUV light source
108A EUV radiation
110 Mirror
112 Mirror
114 Mirror
116 Mirror
118 Mirror
120 Photomask
122 Wafer
124 Optical axis of the projection system
136 Mirror
M1-M6 Mirrors
137 Vacuum housing
200 Mirror
210 Actuator device, in particular suspension
220 Base plate
230 Measurement device
231 Electrode
232 Electrode
233 Electrode
234 Electrode
235 Electrode
236 Electrode
237 Evaluation unit
238 Setting device
239 Memory device
240 Control device
250 Synchronization device
251 Transmission device
252 Extraction unit
261 Sensor device
262 Sensor device
263 Line
264 Line
265 Node
266 Power source
267 Node
268 Node
269 Voltage source
401 Signal-to-noise ratio
402 Lower limit of the signal-to-noise ratio
403 Maximum cut-off frequency of the excitation frequency
404 Possible values of the measurement signal frequency
500 Apparatus for opening and interrupting the optical path
701 Method step
702 Method step
1101 Method step
1102 Method step
1401 Power density spectrum of a disturbance of the measurement signal due to EUV
1402 Upper limit
A Amplitude
B Bandwidth
C Control signal
Cc Capacitance between first layer and second layer of the optical component
$C_{RS1}$ Capacitance between electrode 231 and electrode 233

$C_{LS3}$ Capacitance between electrode 232 and electrode 235
$C_{CS1}$ Capacitance between electrode 233 and electrode 234
$C_{CS3}$ Capacitance between electrode 235 and electrode 236
f Frequency
f1 Frequency of the EUV radiation
f2 Measurement signal frequency
f3 Excitation signal frequency
I Information
M Reference potential
OP Optical path
$R_{MP}$ Resistance
S1 EUV radiation
S2 Measurement signal
S3 Excitation signal
VB Bias potential

What is claimed is:

1. A lithography apparatus, comprising:
a radiation source configured to produce radiation having a repetition frequency;
an optical component configured to guide the radiation within the lithography apparatus;
an actuator device configured to displace the optical component; and
a measurement device configured to determine a position of the optical component via a measurement signal having a measurement signal frequency,
wherein the measurement signal frequency is unequal to the repetition frequency, and the measurement signal frequency is unequal to integer multiples of the repetition frequency, and
wherein the lithography apparatus further comprises a setting device configured to set the measurement signal frequency in dependence on the repetition frequency.

2. The lithography apparatus of claim 1, wherein:

$$|f2 - n \cdot f1| > B;$$

f1 designates the repetition frequency;
f2 designates the measurement signal frequency;
n designates integer multiples of the repetition frequency f1; and
B designates a bandwidth.

3. The lithography apparatus of claim 1, wherein the measurement signal frequency is less than a maximum cut-off frequency for the measurement signal frequency.

4. The lithography apparatus of claim 1, wherein in each case at least one bandwidth is between the measurement signal frequency and the repetition frequency and also between the measurement signal frequency and a respective integer multiple of the repetition frequency.

5. The lithography apparatus of claim 4, wherein the bandwidth is at least 1 kHz.

6. The lithography apparatus of claim 1, wherein the setting device is configured to set the measurement signal frequency in dependence on a variable repetition frequency.

7. The lithography apparatus of claim 1, wherein the measurement signal frequency is a sampling frequency, the measurement device is configured to sample the optical component and electrodes with the sampling frequency, and the electrodes are connected to the optical component.

8. The lithography apparatus of claim 7, wherein the measurement device is configured to excite the optical component and the electrodes with an excitation signal having an excitation frequency and to subsequently sample the optical component and the electrodes with the sampling frequency, and the excitation frequency is equal to the sampling frequency.

9. The lithography apparatus of claim 1, further comprising a control device configured to targetedly apply an electrical bias potential to the optical component.

10. The lithography apparatus of claim 9, wherein the control device has a look-up table to determine the electrical bias potential that is to be applied to the optical component.

11. The lithography apparatus of claim 9, wherein the control device comprises a closed-loop control device which comprises a sensor.

12. The lithography apparatus of claim 1, wherein the radiation source comprises an EUV radiation source configured to produce EUV radiation having the repetition frequency.

13. The lithography apparatus of claim 1, wherein the measurement device comprises a capacitive sensor configured to measure a position of a tilt angle of the optical component.

14. The lithography apparatus of claim 13, wherein the capacitive resistor comprises electrodes in the shape of a comb and are arranged in intermeshed fashion.

15. The lithography apparatus of claim 1, wherein the optical component comprises a mirror.

16. The lithography apparatus of claim 1, wherein the optical component comprises an individual mirror of a field facet mirror of a beam-shaping and illumination system of the lithography apparatus.

17. The lithography apparatus of claim 1, wherein the optical component comprises an individual mirror of a pupil facet mirror of a beam-shaping and illumination system of the lithography apparatus.

18. The lithography apparatus of claim 1, further comprising electrodes connected to the optical component, wherein:
the measurement device is configured to excite the optical component and the electrodes with an excitation signal having a excitation frequency and a voltage value of greater than 3.3 V and less than or equal to 20 V, and to subsequently sample the optical component and the electrodes with the sampling frequency; and
the excitation frequency is equal to the sampling frequency.

19. The lithography apparatus of claim 18, wherein the voltage value of the excitation signal is between 6.6 V and 20 V.

20. A lithography apparatus, comprising:
a radiation source configured to produce radiation having a repetition frequency;
an optical component configured to guide the radiation within the lithography apparatus;
an actuator device configured to displace the optical component;
a measurement device configured to determine a position of the optical component via a measurement signal having a measurement signal frequency; and
an electrical component connected to the optical component,
wherein:
the measurement signal frequency is unequal to the repetition frequency;
the measurement signal frequency is unequal to integer multiples of the repetition frequency;
the actuator device comprises a suspension configured to mount the optical component above a base plate; and
the suspension is configured so that an electrical resistance of a path between the electrode, the capacitive sensor, the optical component, the suspension and the electrical coupling to the measurement device is less than 1 kΩ.

21. The lithography apparatus of claim 20, wherein the suspension for mounting the optical component comprises a doped semiconductor material.

22. The lithography apparatus of claim 21, wherein:
the electrode is connected to the optical component;
the suspension is doped so that the electrical resistance of the path between the electrode, the optical component, the suspension and the electrical coupling to the measurement device is less than 1 kΩ.

23. The lithography apparatus of claim 20, wherein the suspension is configured so that the electrical resistance of the path between the electrode, the capacitive sensor, the optical component, the suspension and the electrical coupling to the measurement device is less than 1 kΩ.

24. The lithography apparatus of claim 20, wherein:
the optical component comprises a first layer, a second layer and a dielectric layer that separates the first and second layers;
the first layer comprises a mirror layer; and
the second layer is configured to electrically couple to the capacitive sensor.

25. The lithography apparatus of claim 24, wherein each of the first and second layers is electrically coupled to a common reference potential.

26. The lithography apparatus of claim 25, wherein the common reference potential is ground.

27. The lithography apparatus of claim 24, wherein an electrical resistance of a path between the dielectric and the reference potential via the second layer and a capacitance define a high-pass filter, the capacitance being formed by the first, dielectric and second layers.

28. A method of operating a lithography apparatus comprising a radiation source to produce radiation having a repetition frequency, the lithography apparatus comprising an optical component to guide guiding the radiation within the lithography apparatus, the lithography apparatus comprising an actuator device to displace the optical component, and the lithography device comprising a measurement device to determine a position of the optical component, the method comprising:
using the measurement device to determine the position of the optical component via a measurement signal having a measurement signal frequency that is unequal to the repetition frequency and also unequal to integer multiples of the repetition frequency; and
using a setting device to set the measurement signal frequency in dependence on the repetition frequency.

29. The lithography apparatus of claim 20, further comprising a setting device configured to set the measurement signal frequency in dependence on the repetition frequency.

* * * * *

UNITED STATES PATENT AND TRADEMARK OFFICE
CERTIFICATE OF CORRECTION

PATENT NO. : 10,261,424 B2
APPLICATION NO. : 15/845590
DATED : April 16, 2019
INVENTOR(S) : Udo Dinger, Markus Holz and Ulrich Bihr It is certified that error appears in the above-identified patent and that said Letters Patent is hereby corrected as shown below:

In the Specification

In Column 3, Line 14, Delete "|f2–n~f1|>B." and insert -- |f2–n·f1|>B. --, therefor.

In Column 5, Line 47, Delete "openloop" and insert -- open-loop --, therefor.

In Column 14, Line 46, Delete "rediation" and insert -- radiation --, therefor.

Signed and Sealed this
Twenty-fourth Day of September, 2019

Andrei Iancu
*Director of the United States Patent and Trademark Office*